United States Patent
Kirihata et al.

[11] Patent Number: 6,052,318
[45] Date of Patent: Apr. 18, 2000

[54] REPAIRABLE SEMICONDUCTOR MEMORY CIRCUIT HAVING PARREL REDUNDANCY REPLACEMENT WHEREIN REDUNDANCY ELEMENTS REPLACE FAILED ELEMENTS

[75] Inventors: Toshiaki Kirihata, Poughkeepsie; Gabriel Daniel, Jamaica Estates, both of N.Y.

[73] Assignees: Siemens Aktiengesellschaft, Munich, Germany; International Business Machines, Corp., Armonk, N.Y.

[21] Appl. No.: 09/218,561
[22] Filed: Dec. 22, 1998
[51] Int. Cl.[7] ........................................ G11C 7/00
[52] U.S. Cl. ........................ 365/200; 365/230.03
[58] Field of Search .............. 365/200, 230.03, 365/194, 205, 207

[56] References Cited

U.S. PATENT DOCUMENTS 5,940,335  8/1999  Kirihata .................................. 364/200
5,970,000  10/1999  Kirihata et al. ........................ 365/200

*Primary Examiner*—David Nelms
*Assistant Examiner*—Hien Nguyen
*Attorney, Agent, or Firm*—Donald B. Paschburg

[57] ABSTRACT

The present disclosure relates to semiconductor memories and more particularly, to an improved method and apparatus for replacing defective row/column lines. In accordance with the present invention, a high replacement flexibility redundancy and method is employed to increase chip yield and prevent sense amplifier signal contention. Redundancy elements are integrated in at least two of a plurality of memory arrays, which don't share the sense amplifiers. Thus, no additional sense amplifiers are required. A defective row/column line in a first array or block is replaced with a redundant row/column line from its own redundancy. A corresponding row/column line whether defective or not is replaced in a second array or block, which does not share sense amplifiers with the first block. The corresponding row/column is replaced to mimic the redundancy replacement of the first block thereby increasing flexibility and yield as well as preventing sensing signal contention.

17 Claims, 6 Drawing Sheets

○ GOOD ELEMENT (GOOD REDUNDANCY ELEMENT RE)

✕ DEFECTIVE ELEMENT

{ UNIT : ELEMENTS REPLACED WITH REDUNDANCY UNIT
       (RU CONTAINING 2REs) SIMULTANEOUSLY

REPAIRABLE SEMICONDUCTOR MEMORY CIRCUIT HAVING PARREL REDUNDANCY REPLACEMENT WHEREIN REDUNDANCY ELEMENTS REPLACE FAILED ELEMENTS

BACKGROUND

1. Technical Field

This disclosure relates to semiconductor memories and more particularly, to an improved method and apparatus for replacing defective row/column lines.

2. Description of the Related Art

CMOS technology has evolved such that the computer market has rapidly opened to a wide range of consumers. Today, multi-media requires at least 32 Mb of DRAM and preferably 64 Mb. This increases the relative cost of the memory system within the computer. In the near future, it is likely that 128 Mb and 512 Mb computers will become commonplace, which suggests a potential demand for 256 Mb and 1 Gb DRAMS (Dynamic Random Access Memory) and beyond. Despite the huge array size and lithographic difficulties that ensue, it is more important than ever to increase the chip yield. Process engineers are constantly attempting to reduce, and ultimately eliminate, or at the very least, mask defects. Faults that inevitably remain in the chip are generally overcome using special circuit designs and more specifically, redundancy replacement.

A typical redundancy architecture, which is commonly used for low density DRAMs is shown in FIG. 1a. FIG. 1a depicts a plurality of spare elements (redundancy cells) used for replacing defective elements (defective cells) within the domain, and which are appended to each block (sub array) comprising a plurality of elements (cells). The sense amplifiers (not shown) are located between adjacent blocks, providing support not only for elements but also the redundancy elements. Each redundancy unit (RU) is comprised of few redundancy elements (REs), (e.g., two RE per RU are illustrated therein), and which are used to repair existing faults (labeled X) within the corresponding block. This scheme, labeled intra-block replacement, increases the redundancy area overhead as the number of blocks increases for high-density memories, since each block composes a domain for the replacement, and the domains in different blocks are mutually exclusive to each other. This requires at least one or preferably two RUs in each block. Thus, the efficiency of the RUs is rather poor in view of its inflexibility which reduces the chip yield substantially when faults are clustered in a given block. The above-mentioned concept is embodied in a configuration described in the article by T. Kirihata et al., entitled "A 14 ns 4 Mb DRAM with 300 mW WActive Power", published in the IEEE journal of Solid State Circuits, Vol. 27, pp. 1222–1228, September 1992.

Another redundancy architecture, known as a flexible redundancy replacement configuration, is shown in FIG. 1b, wherein a memory is depicted having a redundancy block (array) as a large domain of RUs to selectively replace failing elements anywhere in the memory. In this configuration, REs within the RU can repair faults (labeled X) located in any block within the memory. The advantage of this arrangement over the previously described intra-block replacement is that one section, namely a redundancy block, having a certain number of RUs may advantageously be used to service any number of blocks forming the memory. This translates into a substantial savings of real estate for the RUs over the previous scheme. It does, however, require additional sense amplifiers to support the redundancy block. More details regarding the above configurations and the various trade-off may be found in an article by T. Kirihata et al., "A fault-Tolerant Design for 256 Mb DRAMs" published in the Digest of Technical Papers of the 1995 Symposium on VLSI Circuits, pp. 1525–1534, October 1997; in and article by T. Sugibayashi et al., "A 30 ns 256 Mb DRAM with Multi-divided Arrays Structure", published in the IEEE Journal of Solid State Circuits, Vol. 28, pp. 1092–1098, November 1993; and in an article by H. L. Kalter et al., "A 50 ns 16 Mb DRAM with a 10 ns Data Rate and On-Chip ECC", published in the IEEE Journal of Solid State Circuits, Vol. 25, pp. 1118–1128, October 1990.

Another redundancy Architecture, shown in FIG. 1c, employs a flexible redundancy replacement with an intra-block redundancy configuration. In this architecture, RUs are integrated in each sub-array, as in the intra-block replacement. It does, however, allow the use of RUs to repair a fault flexibly for other blocks, as in the flexible redundancy replacement with redundancy block. Note that the additional sense amplifiers are not required for enabling the flexibility, resulting in less design space overhead. However, the data contention problem occurs when two or more sub-arrays, which have a same flexible domain for the replacement, are activated simultaneously. The detailed data contention problem is described with respect to FIG. 2. FIG. 2 shows a 16 Mb bank 12, consisting of four 4 Mb blocks 16. Each block contains a plurality of wordlines (WL), each contacting a plurality of cells. Each block 16 also contains a plurality of redundancy wordlines (RWLs) 18, each containing a plurality of redundancy cells. For simplicity, the column redundancy are ignored, however, redundancy columns can also be integrated in a similar manner. Sense amplifiers 14 are typically arranged and shared between adjacent blocks 16. It is assumed that two wordlines (WL1 in block 1, and WL3 in block 3) are activated simultaneously. (Note that two WLs in block 0 and 1, or in blocks 2 and 3 cannot be activated simultaneously, since the sense amplifiers are shared between blocks 0 and 1 and blocks 2 and 3). The cell data from WL1 is amplified with sense amplifiers 14-b and 14-c, and the cell data from WL3 are amplified with sense amplifiers 14-d and 14-e. When the WL1 is defective, it should be replaced with redundancy wordline (RWL) as a redundancy replacement. A data contention problem occurs when the defective WL1 is replaced with RWL physically located in block 3. In this case, two wordline WL3 and RWL within block 3 are activated simultaneously. FIG. 3 is a detailed schematic, showing the WL3, RWL and sense amplifiers 24. The cells coupled to the WL3 and the redundancy cells couple to RWL store data independently. This makes sensing impossible, since two bit data is transferred to the pair of BLs for sensing. This problem is unavoidable when using the flexibly redundancy replacement with intra-block redundancy configuration. In conclusion, the FIG. 1c approach is only appreciable when one block is activated, otherwise, there is always a probability of data contention due to flexible redundancy replacement.

FIG. 4 shows the flexible redundancy replacement with redundancy block concept which is similar to the FIG. 1b. It is assumed that WL1 in block 0 and WL2 in block 2 are activated simultaneously. When WL2 is defective, it is replaced with RWL physically located in redundancy block. The data contention problem can be avoided, since the redundancy block as sense amplifiers 14R, although this could result in an area penalty. It is, however, still a data contention problem when the WL0 and WL2 are both defective, and replaced simultaneously with two RWLs physically located in a single redundancy block. Having two redundancy blocks can overcome the data contention, however, it requires additional sense amplifiers. In conclusion, the FIG. 1b approach is not suitable when multi-blocks are activated simultaneously.

The present invention overcomes this data contention problem in the multi-block activations, while allowing for flexible redundancy replacement spurting a plurality of blocks without having any additional sense amplifiers.

SUMMARY OF THE INVENTION

According to an embodiment of the present invention, the semiconductor memory having parallel redundancy replacement comprises a plurality of memory arrays each comprising a plurality of elements, where at least two of said plurality of memory arrays comprises a plurality of redundancy elements. The plurality of memory arrays are divided by sense amplifier banks wherein adjacent memory arrays share the sense amplifier bank there between. At least two redundancy elements arranged in at least two domains, each of said at least two domains comprising at least one of said memory arrays and at least one of said sense amplifier banks. The at least two of said plurality of memory arrays located within said at least two domains are accessed with the same logical address, and are replaced simultaneously with the at least two redundancy elements located in said at least two domains when at least one of the simultaneously accessed memory arrays is defective. The replacement does not use the same sense amplifier bank simultaneously.

According to another embodiment, the method for improving yield in semiconductor memories comprises the steps of: providing a plurality of memory banks, each bank comprising a plurality of memory arrays, the memory arrays being divided by sense amplifier banks wherein adjacent memory arrays share the sense amplifier bank there between. At least two redundancy elements replace failed elements which are divided into a first domain and a second domain, the first domain and second domain existing in memory arrays that use different sense amplifier banks. A failed device is replaced by a redundant device in one of the first domain and the second domain, and an element corresponding to a logically same position as the failed element within a different memory array using a different sense amplifier bank than the memory array of the failed element is replaced by a redundant element in the other of the first domain and the second domain. The failed element is replaced by activating the redundant element in one of the first and second domains, and replacing the element corresponding to a logically same position as the failed device by activating the redundant element in the other of the first and second domains thereby reducing signal contention at the sense amplifier banks.

BRIEF DESCRIPTION OF DRAWINGS

This disclosure will present in detail the following description of preferred embodiments with reference to the following figures wherein.

DETAILED DESCRIPTION OF PREFERRED EMBODIMENTS

The present disclosure relates to semiconductor memories and more particularly, to an improved method and apparatus for replacing defective row/column lines. In accordance with the present invention, a high replacement flexibility redundancy and method is employed to increase chip yield and prevent sense amplifier signal contention. A parallel redundancy is used to achieve this as well as to maintain a conventional number of fuses. A defective row/column line in a first array or block is replaced with a redundant row/column line from its own redundancy. A corresponding row/column line whether defective or not is replaced in a second array or block, which does not share sense amplifiers with the first block. The corresponding row/column is replaced to mimic the redundancy replacement of the first block thereby increasing flexibility and yield as well as preventing sensing signal contention.

Figure 5:
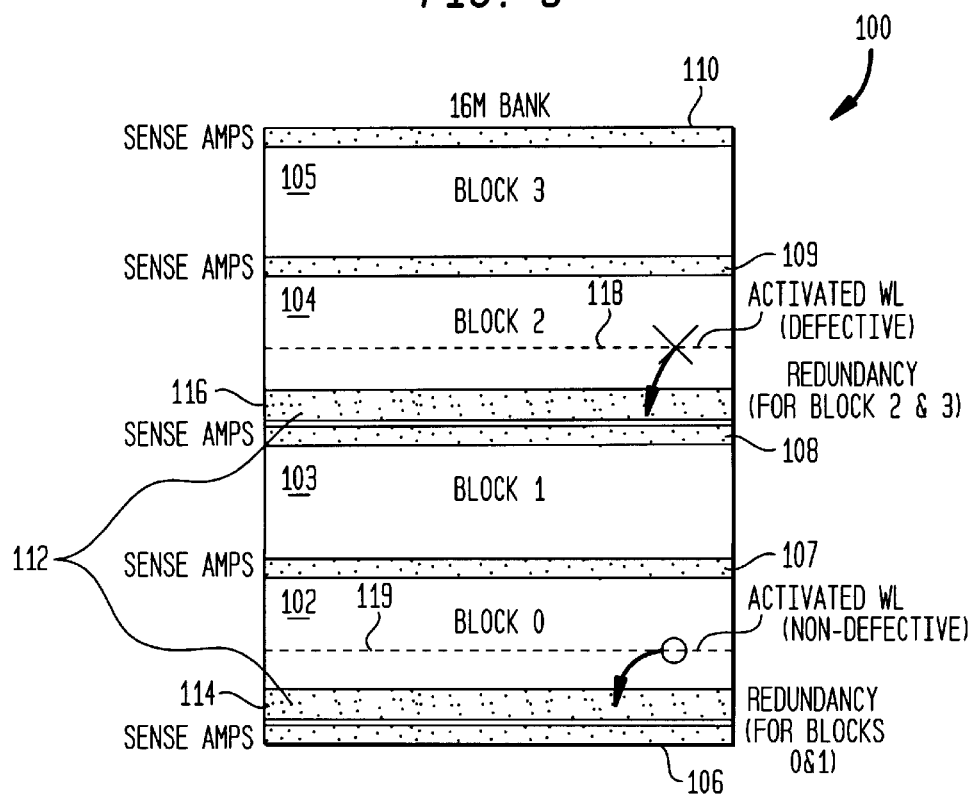
FIG. 5 is a schematic diagram of a memory bank in accordance with the present invention.

Referring now in specific detail to the drawings in which like reference numerals identify similar or identical elements throughout the several views, FIG. 5 schematically illustrates a 16 Mb memory bank 100. Memory bank 100 is partitioned into blocks 0 through 3. Each block includes a memory array 102 through 105 and a sense amplifier bank 106 through 110 disposed between each block. Sense amplifiers of sense amplifier banks 106 through 110 are shared between adjacent blocks, for example, sense amplifier bank 107 positioned between block 0 and block 1 is shared by both blocks 0 and 1. Redundant rows or columns may be included with each block. For illustrative purposes, the present invention will be described with reference to redundant rows and therefore will refer to redundant word lines. However, the invention also applies to redundant columns and is equally applicable for redundant bit lines. Also for illustrative purposes a 64 Mb memory chip having 16 Mb memory banks is used to describe the present invention. However, the present invention is applicable to memory elements having other sizes as well.

As shown in FIG. 5, a redundancy 112 is divided into two domains. A first domain 114 is located in, for example, block 0. A second domain 116 is located in a block in which sense amplifiers used for the first domain 114 are not used for the second domain 116, for example, block 2 or block 3. It is also contemplated that the present invention may include a redundancy divided between blocks 1 and 3 to achieve the same results. By equally dividing redundancy 112 between two blocks, first domain 114 serves as a replacement for defects in blocks 0 and 1 while second domain 116 serves as a replacement for defects in blocks 2 and 3.

During operation, redundancy replacement of defective or malfunctioning word lines is performed in parallel. That is, a defective word line 118 in memory array 104 is replaced by a redundant word line located in second domain 116 as well as a corresponding redundant row in first domain 114 which does not share sense amplifiers with second domain 116. Instead of keeping the redundancy in one block as in the prior art, the present invention separates the redundancy between two blocks which do not share sense amplifiers. As in the prior art, two or a multiple of two, word lines are simultaneously replaced to repair a defective word line. In the present invention, one word line is replaced in the block where the defect has occurred and a second is activated in a block that does not share sense amplifiers with the first block with the defective word line. The second redundant replacement is replaced whether there is a defect in that block or not. The second redundant replacement further corresponds to a location mimicking the location of the first redundant word line within their respective blocks.

As shown in FIG. 5, defective word line 118 in block 2 is replaced by the redundant word line in second domain 116. The word line in block 0 is also replaced by a second redundant word line 114 located at the same location in block 0 as the location of the redundant word line used in block 2. The redundant word line 114 is used from block 0 regardless of whether or not there is a defect in block 0. By separating redundant replacement between block 0 and block 2, there is no signal contention at the sense amplifier banks since block 0 and block 2 do not share the same sense amplifiers. Even though redundancies have been equally separated, they work in parallel to give a fully flexible 16 Mb repair region for a 64 Mb memory chip.

Figure 1A:
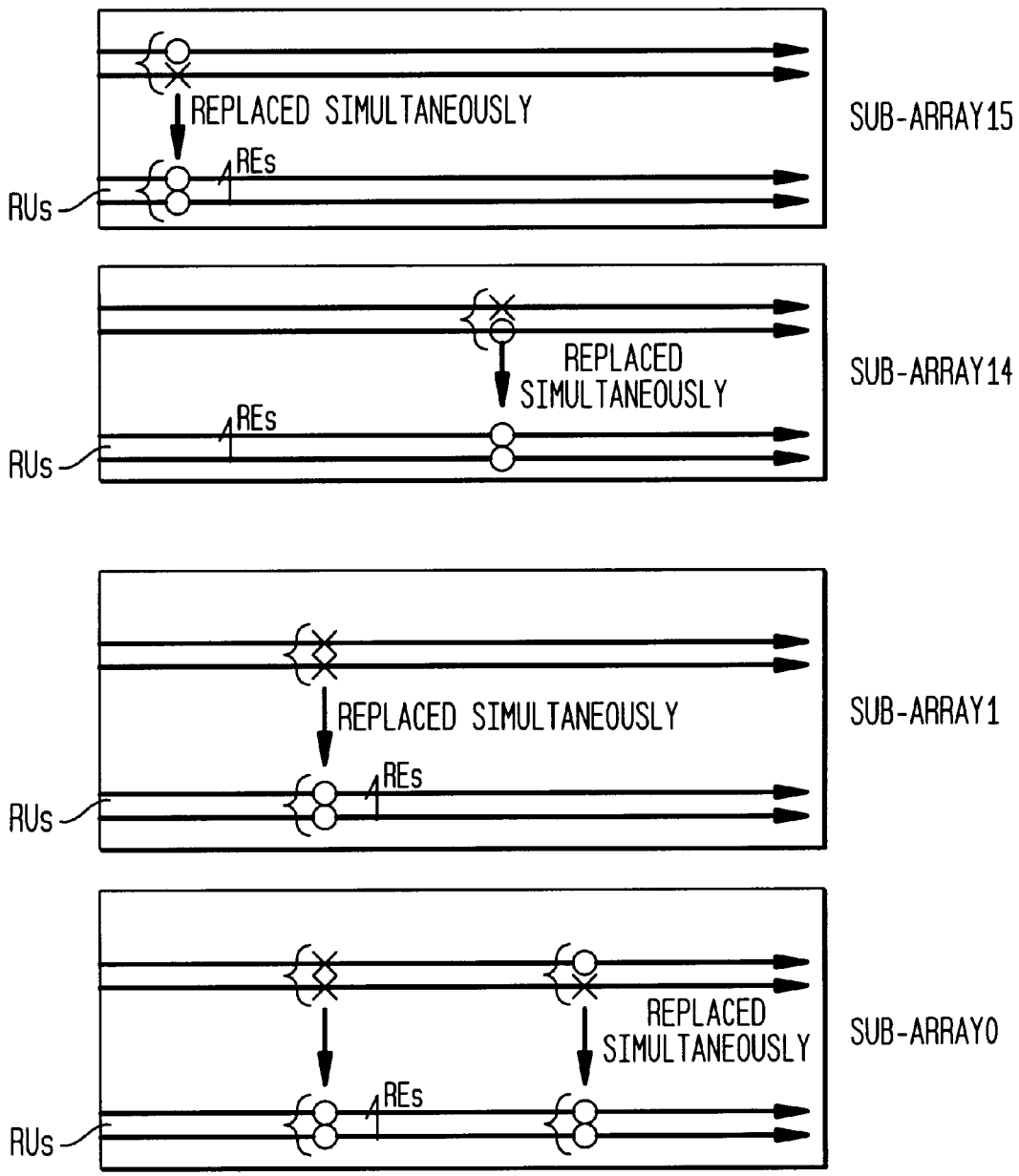
FIG. 1a is a redundancy architecture commonly used for low density DRAMS of the prior art.
Figure 1B:
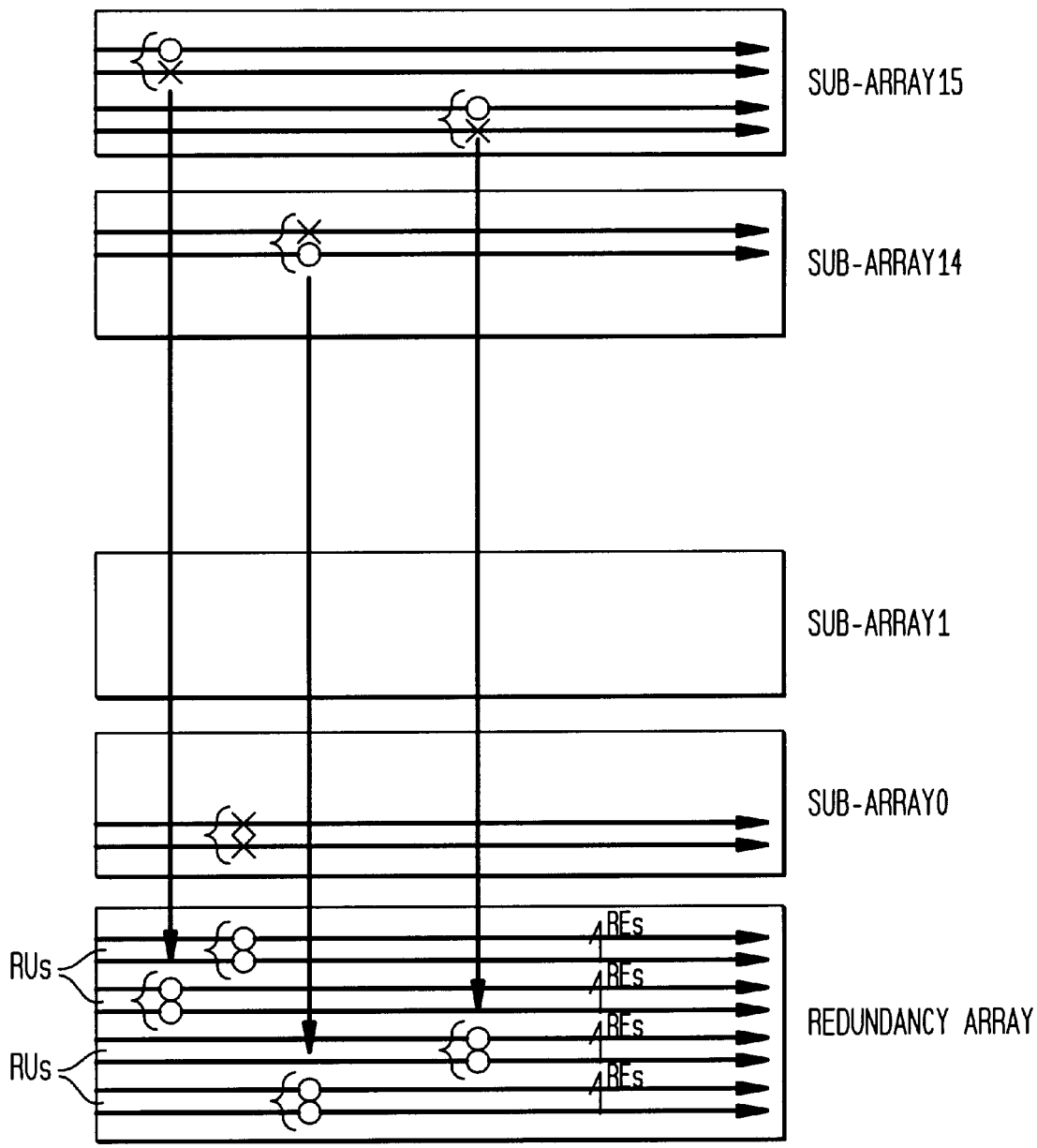
FIG. 1b is another redundancy architecture of the prior art employing a flexible redundancy replacement configuration.
Figure 1C:
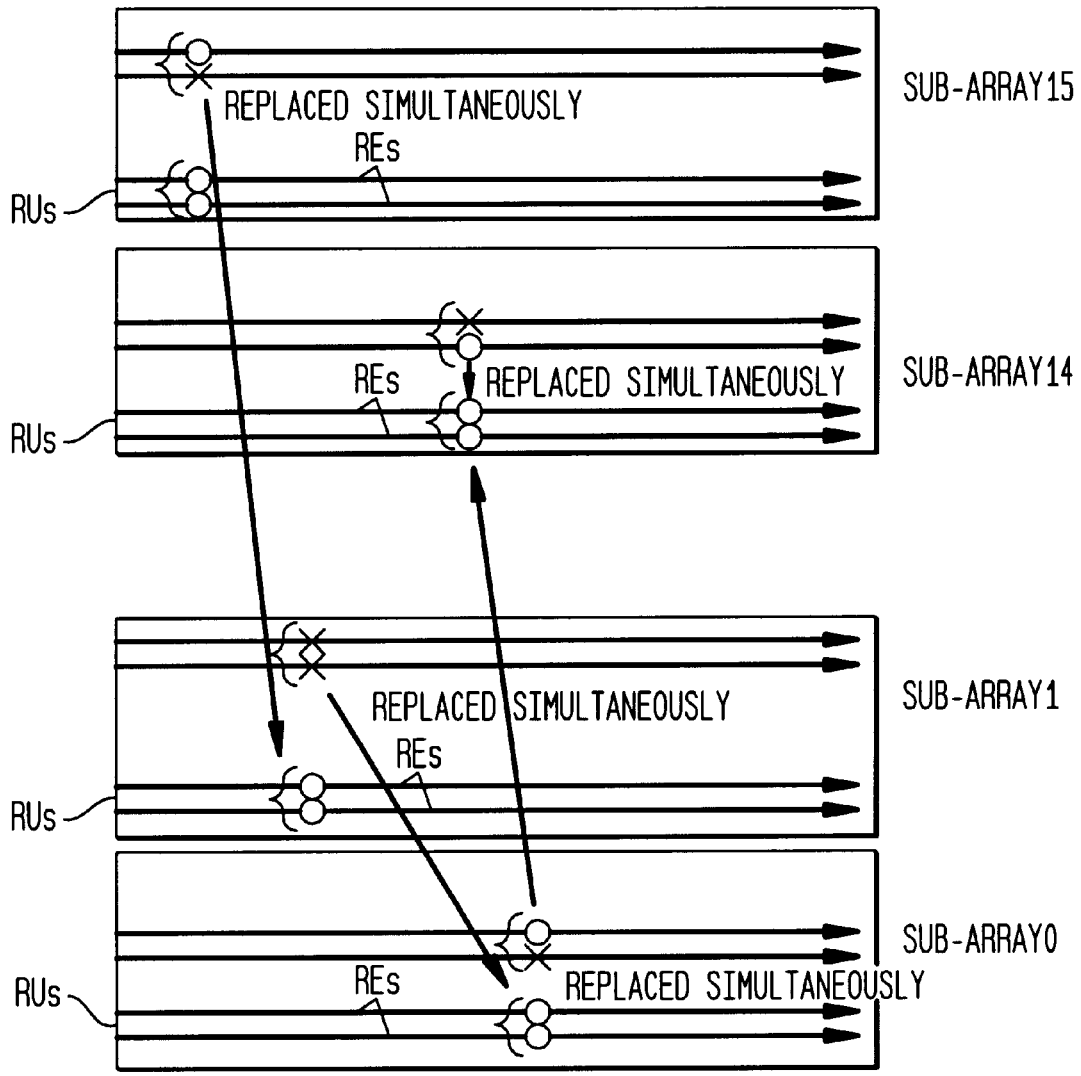
FIG. 1c is another redundancy architecture of the prior art employing a flexible redundancy replacement with an intra-block redundancy configuration.
Figure 2:
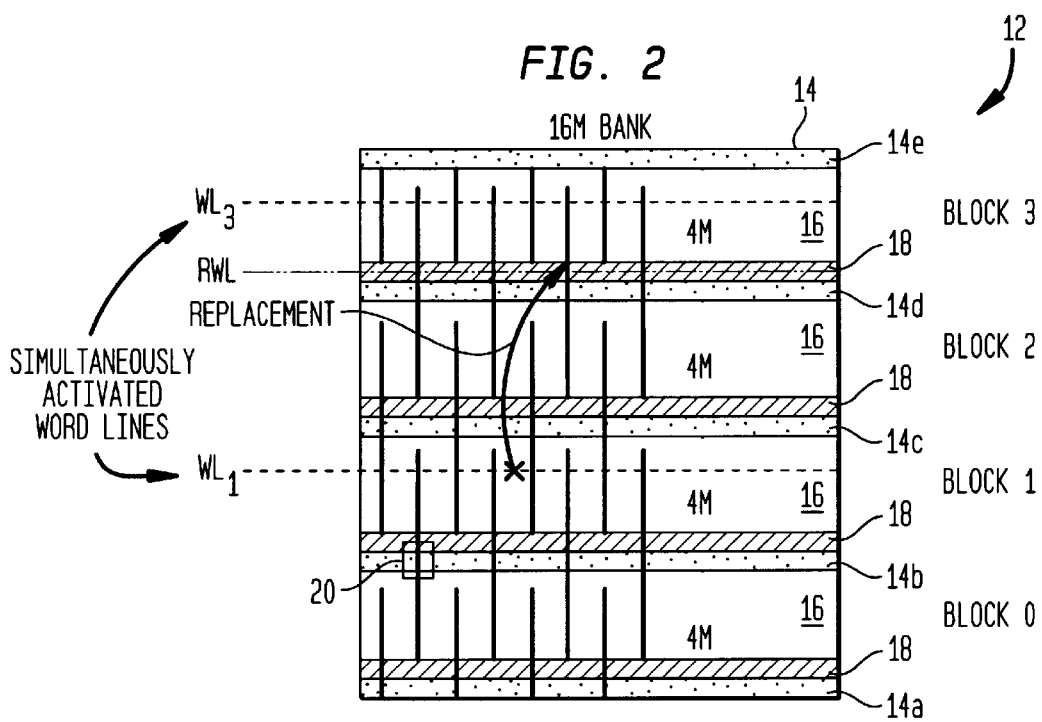
FIG. 2 is a schematic diagram showing a conventional interleaved sensing scheme for sense amplifiers.
Figure 4:
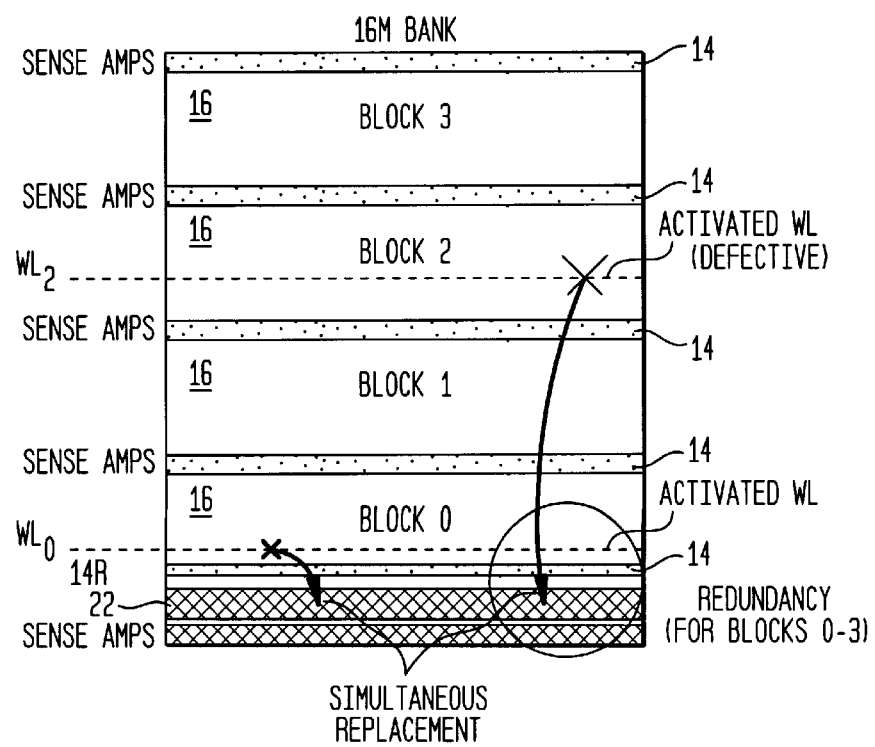
FIG. 4 is a schematic diagram of a conventional memory bank.
Figure 3:
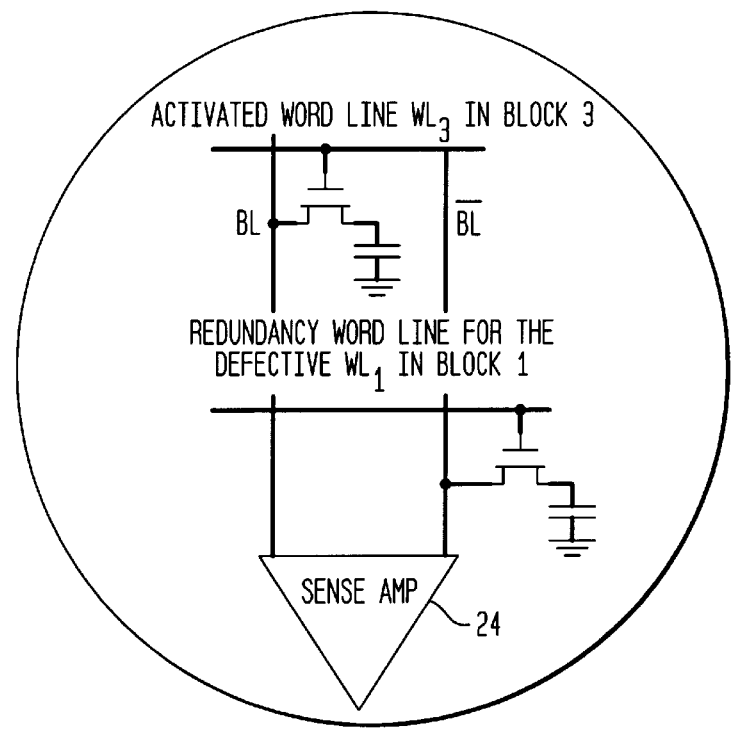
FIG. 3 is a schematic diagram showing a conventional sense amplifier with signal contention.
Figure 6:
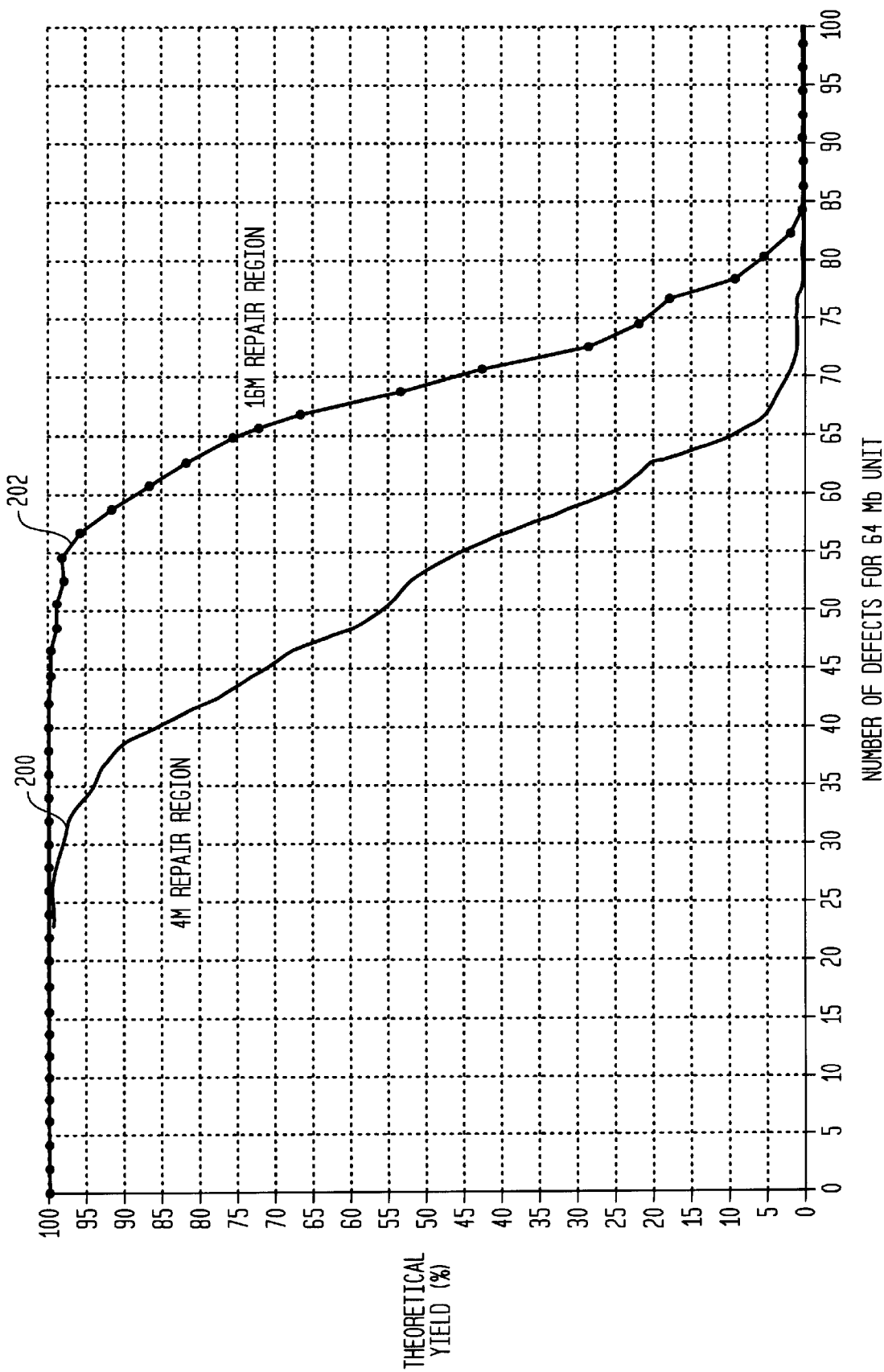
FIG. 6 is a plot of theoretical yield versus a number of defects for different repair regions.

To illustrate the advantages of the fully flexible 16 Mb repair, FIG. 6 shows a plot of theoretical chip yield versus a number of defects on the chip for a 64 Mb memory chip. Curve 200 indicates the prior art redundancy method with a flexibility yielding a 4 Mb repair region. Curve 202 indicates the redundancy method of the present invention with a flexibility yielding a 16 Mb repair region. For the prior art curve 200 (i.e., 4 Mb intra-block redundancy replacement in FIG. 1a), about 30% fewer defects can be accommodated than for curve 202 assuming a 50% yield. Further, if clustering of defects is accounted for (define clustering), there would be an additional yield benefit for the 16 Mb repair region configuration and a further drawback for the 4 Mb repair region configuration.

According to the present invention, a maximum possible repair region flexibility is achieved while signal contention during sensing of sense amplifiers is prevented. Further due to the parallel replacement configuration, which integrates redundancy wordlines in at least two of a plurality of memory arrays, no additional sense amplifiers are required. Having described preferred methods and embodiments for (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by Letters Patent is set forth in the appended claims.

What is claimed is:

1. A semiconductor memory having parallel redundancy replacement comprising:

a plurality of memory arrays each comprising a plurality of elements, and at least two of said plurality of memory arrays comprising a plurality of redundancy elements, said plurality of memory arrays being divided by sense amplifier banks wherein adjacent memory arrays share the sense amplifier bank there between;

at least two redundancy elements arranged in at least two domains, each of said at least two domains comprising at least one of said memory arrays and at least one of said sense amplifier banks;

wherein at least two of said plurality of memory arrays located within said at least two domains are accessed with the same logical address, and are replaced simultaneously with said at least two redundancy elements located in said at least two domains when at least one of the simultaneously accessed memory arrays is defective, said replacement not using the same sense amplifier bank simultaneously.

2. The semiconductor memory having improved redundancy as recited in claim 1, wherein the redundancy includes word lines.

3. The semiconductor memory having improved redundancy as recited in claim 1, wherein the redundancy includes bit lines.

4. The semiconductor memory having improved redundancy as recited in claim 1, wherein each memory bank includes four blocks arranged substantially parallel to each other and the first domain is located in a first block and the second domain is located in a third block.

5. The semiconductor memory having improved redundancy as recited in claim 1, wherein each memory bank includes four blocks arranged substantially parallel to each other and the first domain is located in a second block and the second domain is located in a fourth block.

6. The semiconductor memory having improved redundancy as recited in claim 1, wherein the first domain replaces failed elements in a first half of the memory bank and the second domain replaces failed elements in a second half of the memory bank.

7. The semiconductor memory having improved redundancy as recited in claim 1, wherein each failed element and the element corresponding to the logically same position are replaced by at least one element in the first domain and at least one element in the second domain wherein the at least one element in the first domain is equal in number to the at least one element in the second domain.

8. The semiconductor memory having improved redundancy as recited in claim 1, wherein each memory bank includes 16 megabits of memory.

9. The semiconductor memory having improved redundancy as recited in claim 1, wherein each memory array includes 4 megabits of memory.

10. A method of improving yield in semiconductor memories comprising the steps of:

providing a plurality of memory banks, each bank comprising a plurality of memory arrays, the memory arrays being divided by sense amplifier banks wherein adjacent memory arrays share the sense amplifier bank there between, at least two redundancy elements for replacing failed elements divided into a first domain and a second domain, the first domain and second domain existing in memory arrays that use different sense amplifier banks;

replacing the failed element by activating the redundant element in one of the first and second domains; and replacing the element corresponding to a logically same position as the failed device by activating the redundant element in the other of the first and second domains thereby reducing signal contention at the sense amplifier banks.

11. The method of improving yield in semiconductor memories as recited in claim 10, wherein the step of replacing the failed element further comprises replacing the failed element by a plurality of devices.

12. The method of improving yield in semiconductor memories as recited in claim 11, wherein the step of replacing the element corresponding to a logically same position as the failed element further comprises replacing the device corresponding to the logically same position as the failed element by a plurality of elements equal in number to the plurality of elements replacing the failed element.

13. The method of improving yield in semiconductor memories as recited in claim 10, wherein the redundancy includes word lines.

14. The method of improving yield in semiconductor memories as recited in claim 10, wherein the redundancy includes bit lines.

15. The method of improving yield in semiconductor memories as recited in claim 10, further comprises the step of defining each memory bank by four blocks arranged substantially parallel to each other, the first domain being located in a first block and the second domain being located in a third block.

16. The method of improving yield in semiconductor memories as recited in claim 10, further comprises the step of defining each memory bank by four blocks arranged substantially parallel to each other, the first domain being located in a second block and the second domain being located in a fourth block.

17. The method of improving yield in semiconductor memories as recited in claim 10, wherein the step of replacing the failed element includes the steps of:

replacing failed elements in a first half of the memory bank by using redundant elements in the first domain; and replacing failed elements in a second half of the memory bank by using redundant elements in the second domain.

* * * * *